United States Patent
Toyokawa

Patent Number: 5,449,532
Date of Patent: Sep. 12, 1995

[54] METHOD OF MANUFACTURING SILICON SUBSTRATE

[75] Inventor: Fumitoshi Toyokawa, Tokyo, Japan

[73] Assignee: NEC Corporation, Tokyo, Japan

[21] Appl. No.: 783,147

[22] Filed: Oct. 28, 1991

[30] Foreign Application Priority Data

Oct. 29, 1990 [JP] Japan ................................. 2-291174

[51] Int. Cl.6 .......................... C23C 16/24; B05D 3/02
[52] U.S. Cl. ..................................... 427/255; 427/309; 427/397.7
[58] Field of Search ................... 427/255, 248.1, 397.7, 427/309

[56] References Cited

U.S. PATENT DOCUMENTS

| | | | |
|---|---|---|---|
| 4,461,670 | 7/1984 | Celler et al. | 156/603 |
| 4,501,060 | 2/1985 | Frye et al. | 29/576 W |
| 4,590,130 | 5/1986 | Cline et al. | 428/446 |

Primary Examiner—Shrive Beck
Assistant Examiner—Bret Chen
Attorney, Agent, or Firm—Burns, Doane, Swecker & Mathis

[57] ABSTRACT

A method of manufacturing a silicon single crystal substrate with the back surface thereof having deposited polycrystalline silicon. The method includes steps of depositing polycrystalline silicon on a coarsely polished silicon single crystal substrate, mirror surface finish polishing one substrate surface and carrying out a high temperature thermal treatment. The thermal treatment is carried out either prior or subsequent to the polycrystalline silicon deposition step. The thermal treatment has the effects of causing diffusion of interstitial oxygen Oi from the substrate surface to the outside and also causing contraction and vanishing of Oi precipitation nuclei in the substrate.

14 Claims, 3 Drawing Sheets

METHOD OF MANUFACTURING SILICON SUBSTRATE

BACKGROUND OF THE INVENTION

1. Field of the Invention

This invention relates to a method of manufacturing a silicon single crystal substrate having a gettering capacity, which is used for manufacturing such semiconductor devices as large-scale integrated circuits.

2. Prior Art

Up to date, semiconductor devices such as large-scale integrated circuits are manufactured in very clean environments. However, a silicon single crystal substrate (hereinafter referred to as Si substrate) is subject to contamination, although very slightly, due to heavy metals (i.e., iron, nickel, copper, etc.) while it is subjected to many processes such as dry etching. Such contamination due to heavy metals leads to deterioration of the eventual semiconductor device and ultimately reduces the yield of manufacture of the product.

The contaminant impurities as noted above are removed from device formation regions by means of gettering. As one of the well-known gettering techniques, there is a technique of extrinsic gettering. In this technique, crystalline defects or like strains are introduced mainly into the back surface of the Si substrate to capture contaminant impurities attached to the Si substrate surface, i.e., the device formation surface. In a reported method of the extrinsic gettering, a polycrystalline silicon film is formed on the Si substrate back surface, and crystalline defects in crystal grain and grain boundaries in the polycrystalline silicon film serve as a source of gettering, as disclosed in, for instance, Japanese Patent Laid-Open No. 282,814/1989. Such a Si substrate is obtained by depositing, on its entire surface in a coarsely polished state, a polycrystalline silicon film and mirror surface finish polishing only one principal surface. In this case, the polycrystalline silicon is deposited to about 1 to 2 microns by chemical vapor deposition at a temperature of about 600° to 800° C.

As another well-known means of Si substrate gettering, there is a process called intrinsic gettering, which utilizes crystalline defects due to precipitation of interstitial oxygen (Oi) contained in the Si substrate. It is well known in the art that with a Si substrate with extrinsic gettering provided by polycrystalline silicon, the generation of crystalline defects due to the precipitation of Oi is enhanced on the back surface side of the substrate due to strain produced by the polycrystalline silicon film or by absorption of interstitial Oi Transactions of the 37-th Applied Physics Association Meeting, 1990. Vol. 29a-R-1 p. 219). However, the polycrystalline silicon deposition temperature (i.e., 600° to 800° C.) is in a temperature range, in which Oi precipitation nuclei are formed most greatly. Therefore, the region of generation of crystal defects due to the Oi precipitation readily reaches the device formation region (i.e., Si substrate surface). To suppress such generation of surface crystalline defects due to the Oi precipitation, the concentration of Oi in the Si substrate is held to be low, as disclosed in Japanese Patent Laid-Open No. 282,814/1989.

With the well-known extrinsic gettering process using polycrystalline silicon, the gettering effect of the polycrystalline silicon is reduced with the progress of the process of device manufacture. This is attributable to the following facts. First in a thermal treatment (for instance annealing or oxidation), crystal grains grow as grain boundaries are reduced. Since grain boundaries are a source of gettering, such thermal treatments result in a reduction of gettering capability. Second, in an oxidation step, the polycrystalline silicon is oxidized into a silicon oxide film thereby reducing the thickness of the polycrystalline silicon film itself.

Further, at the time of the polycrystalline silicon deposition (at a deposition temperature of about 600° to 800° C.), the generation of Oi precipitation nuclei can not be perfectly suppressed. If it is intended to cause partial generation of crystalline defects due to the Oi precipitation on the back surface side alone of the substrate, defects due to the Oi precipitation are readily generated in the neighborhood of the substrate surface, which constitutes a device formation region. In order to suppress the crystalline defects generation on the Si substrate surface due to the Oi precipitation, it is necessary to reduce the Oi concentration in the substrate to an extent free from the Oi precipitation. Doing so, however, disables application of the intrinsic gettering, which is most superior in view of the continuity of the gettering effect (see Japanese Journal of Applied Physics, Vol. 27, NO. 7, 1988, pp. 1,220 to 1,223).

With the Si substrate, to which has been applied the sole extrinsic gettering with the deposition of the polycrystalline silicon on the back surface of the substrate, the continuity of the gettering effect is low, thus posing the problem of the production yield reduction in the process of device manufacture. On the other hand, where the intrinsic gettering is applied in combination without provision of any limit of the Oi concentration, crystalline defects due to the Oi precipitation are generated greatly on the Si substrate surface. This again leads to the problem of the element production yield reduction.

SUMMARY OF THE INVENTION

The present invention has an object of providing a method of Si substrate manufacture, which permits suppression of the crystalline defect generation due to the Oi precipitation.

According to the invention, there is provided a method of manufacturing a silicon single crystal substrate with the back surface thereof having deposited-polycrystalline silicon, which comprises the steps of depositing polycrystalline silicon by chemical vapor deposition on the entire surface of a coarsely polished silicon single crystal substrate prepared by mechanical polishing and chemical polishing, subsequently polishing one principal surface of the substrate by mechanical/chemical polishing to a mirror surface, and subsequently carrying out a thermal treatment at a temperature of 1,100° C. or above on the substrate.

According to the invention, there is also provided a method of manufacturing a silicon single crystal substrate with the back surface thereof having deposited polycrystalline silicon, which comprises the steps of carrying out a thermal treatment at a temperature of 1,100° C. or above on a coarsely polished silicon substrate prepared by mechanical polishing and subsequently polishing one principal surface of the substrate by mechanical/chemical polishing to a mirror surface.

According to the invention, the high temperature thermal treatment at 1,100° C. or above is carried out on the Si substrate either prior or subsequent to the polycrystalline silicon deposition, and subsequently one principal substrate surface is mirror surface finished.

The high temperature thermal treatment has the effects of causing diffusion of Oi from the surface of the coarsely polished Si substrate to the outside thereof and also causing shrinkage and vanishing of Oi precipitation nuclei in the substrate.

BRIEF DESCRIPTION OF THE DRAWINGS

The above and other objects, features and advantages of the invention will become more apparent from the description of the preferred modes of the invention, when the same is read with reference to the accompanying drawings, in which.

PREFERRED MODES OF THE INVENTION

EXAMPLE 1

Figure 1:
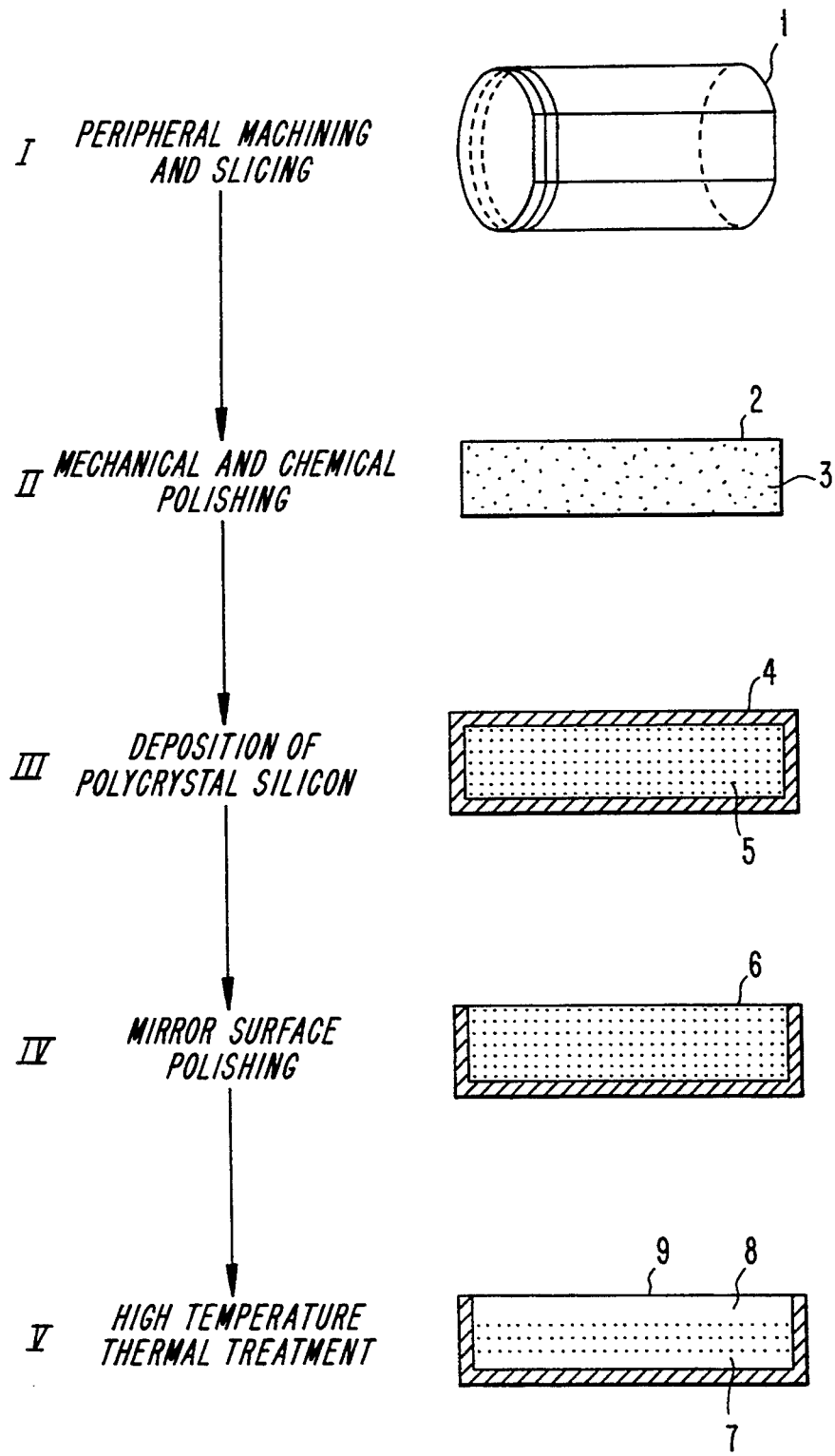
FIG. 1 is a view schematically showing the steps of manufacture in Example 1 of the invention.

FIG. 1 schematically shows the steps of manufacture in Example 1 of the invention.

Shown at I in the Figure is a ground Si single crystal ingot 1 with an Oi concentration $13 \times 10^{17}$ to $15 \times 10^{17}$ atoms/cm$^2$. This ingot 1 was sliced, and the sliced piece was polished mechanically and chemically to obtain a coarsely polished Si substrate 2, as shown at II in the Figure. This substrate had grown-in Oi precipitation nuclei 3, which were generated due to the effect of thermal history at the time of producing the Si single crystal ingot 1. These nuclei 3 were present non-uniformly in both size and distribution. Subsequently, on this coarsely polished Si substrate 2 was deposited polycrystalline silicon 4, as shown at III in the Figure, to a thickness of 1.2 microns by chemical vapor deposition at 680° C. using monosilane as the material. At this time, many Oi precipitation nuclei 5 were generated and grown in the substrate. These nuclei 5 were greater in both density and size than the grown-in precipitation nuclei 3 noted above. Subsequently, one principal or major surface of the substrate was mirror surface finish polished by a mechanical/chemical polishing process to obtain a device formation surface 6, as shown at IV in the Figure. The substrate was then subjected to a high temperature thermal treatment at 1,180° C. for 4 hours. The results were that the Oi precipitation nuclei 5 in the substrate were changed to contracted Oi precipitation nuclei 7, as shown at V in the Figure, and that an outward Oi diffusion region 8 was formed to constitute the substrate surface. The Oi concentration in region 8 was thus reduced to an extent free from the Oi precipitation. In the above way, a Si substrate according to the invention was completed.

The gettering capacity of the Si substrate manufactured as above according to the invention was evaluated by using, as a reference sample, a conventional Si substrate, i.e., a Si substrate obtained by dispensing with the final high temperature thermal treatment. More specifically, on each Si substrate was produced a MOS diode, and the minority carrier generation lifetime $\tau g$ was measured by a MOS c-t method. Prior to the production of the MOS diode, each Si substrate was subjected to a thermal treatment assimilating a process of manufacture of a CMOS device (i.e., a two-step thermal oxidation process at 1,000° C. for 4 hours and at 1,200° C. for 8 hours). Table 1 below shows the results of measurement of $\tau g$. As is seen, the values obtained with the Si substrate in Example 1 of the invention were superior by about one order of magnitude.

After the $\tau g$ measurement, the depth of the defect-free surface layer constituting the substrate surface was measured by cleaving each Si substrate and etching the cleaved surface by Wright etching. In some conventional Si substrates, crystalline defects were generated up to the surface. With the Si substrates according to the invention, defect-free surface layers of at least 50 microns were formed.

TABLE 1

|  | $\tau g$ | Defect-free surface layer |
| --- | --- | --- |
| Example 1 | 3 to 12 msec. | 50 to 130 μm |
| Reference sample | 0.2 to 0.8 msec. | 0 to 30 μm |
| Two-step thermal treatment sample | 1 to 5 msec. | 20 to 80 μm |

Figure 2:
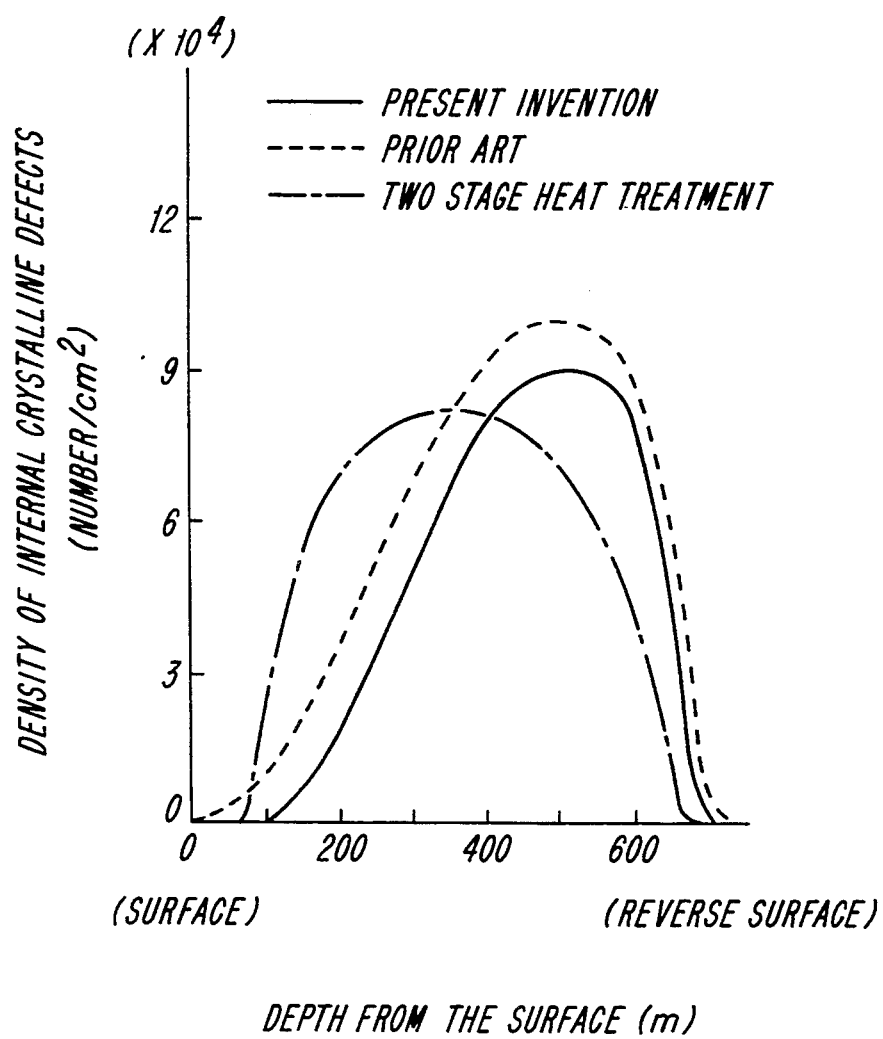
FIG. 2 is a graph showing internal crystalline defects distribution obtained in Example 1.

The density of the internal crystalline defects in the substrate, as shown in FIG. 2, tended to be distributed partially greatly toward the back surface side of the substrate. With the reference sample, the defect generation region extended up to the proximity of the surface. In contrast, a perfectly defect-free surface layer was obtained, which had a depth of up to about 100 microns from the surface.

In order to confirm the production of the above results owing to not only the sole difference in the thermal treatment, a Si substrate with an Oi concentration of $13 \times 10^{17}$ to $15 \times 10^{17}$ atoms/cm$^2$, obtained after a two-step thermal treatment at 680° C. for 2 hours and at 1,180° C. for 4 hours, was tested by producing a MOS diode on it in the manner as described above and measuring the $\tau g$, defect-free layer and internal defect distribution. The same characteristics as according to the invention could not be obtained with the sole thermal treatment (see Table 1 and FIG. 2). This means that the effects of the invention can not be obtained with the sole heat treatment but can be realized only by combining the deposition of polycrystalline silicon and high temperature thermal treatment.

EXAMPLE 2

Figure 3:
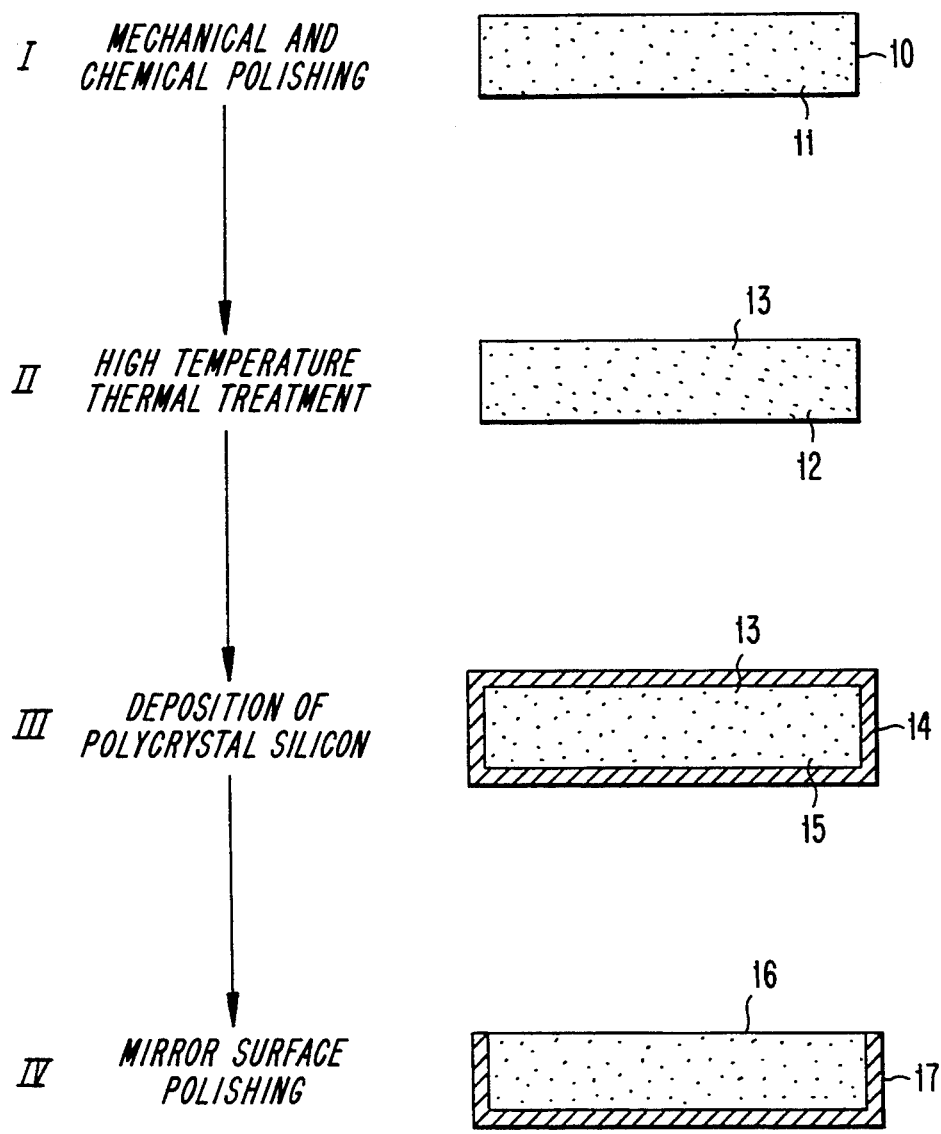
FIG. 3 is a view schematically showing the steps of manufacture in Example 2 of the invention.

FIG. 3 schematically shows the steps of manufacture in Example 2 of the invention.

As in the preceding Example 1, a Si single crystal ingot with an Oi concentration of $13 \times 10^{17}$ to $15 \times 10^{17}$ atoms/cm$^2$ was polished mechanically and chemically to obtain a coarsely polished Si substrate 10, as shown at I in the Figure. The substrate at this time had grown-in Oi precipitation nuclei 11 due to the effects of the history at the time of raising it, the nuclei being present non-uniformly both in size and in distribution. This coarsely polished Si substrate was subjected to a thermal treatment at 1,180° C. for 4 hours to change the latent Oi precipitation nuclei to contracted Oi precipitation nuclei 12, as shown at II in the Figure. At this time, comparatively small grown-in Oi precipitation nuclei vanished, and Oi was diffused outward to form a region 13 with lower Oi concentration owing to the outward diffusion or Oi. Thus, the outward Oi diffusion layer 13 forms a substrate surface layer. Subsequently, polycrystalline silicon 14 was deposited to a thickness of 1.5 microns by chemical vapor deposition at 680° C. using monosilane as the material, as shown at III in the Figure. At this time, the contracted Oi precipitation nuclei were changed to grown Oi precipitation nuclei, but no new Oi precipitation nuclei were generated in the outward Oi diffusion region 13. Finally, the substrate was mirror surface finished by a mechanical/chemical polishing process to obtain a device formation surface 16, as shown at IV in the Figure. In this way, a Si substrate 17 was obtained.

This example is different from the previous Example 1, in that the high temperature thermal treatment is carried out prior to the polycrystalline silicon deposition. By carrying out the thermal treatment prior to the polycrystalline silicon deposition, which has the effects of causing outward diffusion of Oi and also the shrinkage and vanishing of the grown-in Oi precipitation nuclei, it is possible to extremely reduce the crystal defects generated on the Si substrate surface due to the Oi precipitation.

The Si substrates obtained in Examples 1 and 2 were subjected to thermal oxidation at 1,000° C. for 16 hours to cause the Oi precipitation to be proceeded sufficiently, and then the width of the defect-free surface layer was measured by a light scattering method. Table 2 below shows the results.

TABLE 2

|  | Defect-free surface layer | $\tau g$ |
| --- | --- | --- |
| Example 2 | 100 to 140 um | 8 to 12 msec. |
| Example 1 | 30 to 130 um | 3 to 12 msec. |
| Treatment at 1090° C. | 10 to 100 um | 0.5 to 2 msec. |

As is obvious from Table, 2 according to the invention it is possible to obtain defect-free surface layers having a greater depth of the defect-free surface layer than reported in Table 1 since the value noted in Table 1 is due to a difference in the method of measurement (the method in the case of Table 1 being based on selective etching). Table 2 also shows the values of $\tau g$ measured with MOS diodes produced in the manner as described before in connection with Example 1. In the $\tau g$, again less fluctuations and superior results could be obtained in this example.

In Examples 1 and 2, the temperature of the high temperature treatment was set to 1,180° C., but it is possible to set a temperature, which is 1,100° C. or above, and at which contraction of the grown-in Oi precipitation nuclei takes place. Table 2 shows the defect-free surface layer depth and $\tau g$ in the case, in which the high temperature thermal treatment was carried out at 1,090° C. for 4 hours. In this case, either value was inferior to those in Examples 1 and 2. The value remained the same when the time of the treatment at 1,090° C. was extended to 48 hours.

The invention features the high temperature thermal treatment at 1,100° C. or above, which may be carried out either prior or subsequent to the polycrystalline silicon deposition. The Oi concentration in the Si substrate, thickness of the polycrystalline Si layer and temperature and time of the high temperature treatment are set in accordance with the desired depth of the defect-free surface layer in a subsequent device production process.

As has been described in the foregoing, the invention features a high temperature thermal treatment carried out either prior or subsequent to a step of depositing polycrystalline silicon on a Si substrate, which has the effects of suppressing generation of crystal defects due to the Oi precipitation on the Si substrate surface and in the neighborhood thereof and also permitting utmost utility of the capacity of both extrinsic and intrinsic gettering.

What is claimed:

1. A method of manufacturing a silicon body comprising the steps of:
   preparing a silicon single crystal substrate by mechanical polishing and chemical polishing thereof, said silicon single crystal substrate having front, side and back surfaces;
   depositing a polycrystalline silicon film by chemical vapor deposition on said front, side and back surfaces of said silicon single crystal substrate:
   removing a portion of said polycrystalline silicon film to expose said front surface of said silicon single crystal substrate while leaving a remaining portion of said polycrystalline silicon film on said side and back surfaces of said silicon single crystal substrate; and
   subsequently carrying out a thermal treatment at a temperature of 1,100° C. or above on said silicon single crystal substrate.

2. The method of claim 1, wherein during the thermal treatment interstitial oxygen contained in the silicon crystal substrate is diffused from the front surface inwardly into an inner part of the silicon single crystal substrate and a region is formed adjacent the front surface wherein interstitial oxygen concentration is reduced compared to the inner part of the silicon single crystal substrate.

3. The method of claim 1, wherein the removing step is performed by mechanical/chemical polishing the front surface to obtain a mirror surface finish.

4. The method of claim 1, wherein the thermal treatment step is carried out until internal crystalline defects in the silicon single crystal substrate have a higher density toward the back surface.

5. The method of claim 1, wherein the thermal treatment step is carried out until a defect-free surface layer adjacent the front surface is obtained, the defect-free surface layer being free of internal crystalline defects.

6. The method of claim 5, wherein the defect-free surface layer has a thickness of at least 50 $\mu$m.

7. The method of claim 1, wherein the silicon single crystal substrate has an interstitial oxygen content of $13 \times 10^{17}$ to $15 \times 10^{17}$ atoms/cm$^2$.

8. A method of manufacturing a silicon body comprising the steps of;
   preparing a silicon single crystal substrate by mechanical polishing and chemical polishing thereof, said silicon single crystal substrate having front, side and back surfaces;
   carrying out a thermal treatment at a temperature of 1,100° C. or above on said silicon single crystal substrate;
   subsequently depositing a polycrystalline silicon film on said front, side and back surfaces of said silicon single crystal substrate; and
   removing a portion of said polycrystalline silicon film to expose said front surface of said silicon single crystal substrate while leaving a remaining portion of said polycrystalline silicon film on said side and back surfaces of said silicon single crystal substrate.

9. The method of claim 8, wherein during the thermal treatment interstitial oxygen contained in the silicon single crystal substrate is diffused from the front surface inwardly into an inner part of the silicon single crystal substrate and a region is formed adjacent the front surface wherein interstitial oxygen concentration is reduced compared to the inner part of the silicon single crystal substrate.

10. The method of claim 8, wherein the removing step is performed by mechanical/chemical polishing the front surface to obtain a mirror surface finish.

11. The method of claim 8, wherein the thermal treatment step is carried out until internal crystalline defects in the silicon single crystal substrate have a higher density toward the back surface.

12. The method of claim 8, wherein the thermal treatment step is carried out until a defect-free surface layer adjacent the front surface is obtained, the defect-free surface layer being free of internal crystalline defects.

13. The method of claim 12, wherein the defect-free surface layer has a thickness of at least 50 μm.

14. The method of claim 8, wherein the silicon single crystal substrate has an interstitial oxygen content of $13 \times 10^{17}$ to $15 \times 10^{17}$ atoms/cm$^2$.

* * * * *